(12) United States Patent
Jin

(10) Patent No.: US 12,090,685 B2
(45) Date of Patent: Sep. 17, 2024

(54) INGOT TEMPERATURE CONTROLLER AND WIRE SAWING DEVICE HAVING SAME

(71) Applicant: SK Siltron Co., LTD., Gyeongsangbuk-do (KR)

(72) Inventor: Young Il Jin, Seoul (KR)

(73) Assignee: SK SILTRON CO., LTD., Gyeongsangbuk-do (KR)

( * ) Notice: Subject to any disclaimer, the term of this patent is extended or adjusted under 35 U.S.C. 154(b) by 244 days.

(21) Appl. No.: 17/780,162

(22) PCT Filed: May 8, 2020

(86) PCT No.: PCT/KR2020/006073
§ 371 (c)(1),
(2) Date: May 26, 2022

(87) PCT Pub. No.: WO2021/153846
PCT Pub. Date: Aug. 5, 2021

(65) Prior Publication Data
US 2022/0410432 A1 Dec. 29, 2022

(30) Foreign Application Priority Data
Jan. 30, 2020 (KR) ........................ 10-2020-0010913

(51) Int. Cl.
*C30B 15/20* (2006.01)
*B28D 5/04* (2006.01)
*C30B 15/14* (2006.01)

(52) U.S. Cl.
CPC .............. *B28D 5/045* (2013.01); *C30B 15/14* (2013.01); *C30B 15/20* (2013.01)

(58) Field of Classification Search
CPC ............ C30B 5/14; C30B 15/20; B28D 5/045
See application file for complete search history.

(56) References Cited

U.S. PATENT DOCUMENTS

| 8,567,384 B2* | 10/2013 | Oishi | B28D 5/0076 125/16.02 |
| 2006/0249134 A1 | 11/2006 | Kawasaki et al. | |
| 2011/0088678 A1* | 4/2011 | Kitagawa | B28D 5/0076 451/53 |
| 2013/0139800 A1* | 6/2013 | Zavattari | B28D 5/045 125/12 |

FOREIGN PATENT DOCUMENTS

| CN | 102989819 A | * | 3/2013 |
| JP | 2001-079747 | | 3/2001 |
| JP | 2005103683 | * | 4/2005 |

(Continued)

*Primary Examiner* — Robert M Kunemund
(74) *Attorney, Agent, or Firm* — KED & Associates LLP

(57) ABSTRACT

Provided is a wire sawing device comprising an ingot temperature controller, the wire sawing device comprising: a chamber; an ingot clamp supporting an ingot inside the chamber; a first roller and a second roller; a wire which is wound around the first roller and the second roller and cuts the ingot into a plurality of wafers by rotating; a temperature measuring unit which is mounted inside the chamber, in which the ingot is cut, and measures the temperature of the ingot; and a heater unit mounted inside the chamber.

11 Claims, 2 Drawing Sheets

(56) References Cited

FOREIGN PATENT DOCUMENTS

| | | | |
|---|---|---|---|
| JP | 2006-150505 | | 6/2006 |
| KR | 10-2011-0090016 | | 8/2011 |
| KR | 10-2013-0017819 | | 2/2013 |
| KR | 20140088714 A | * | 7/2014 |
| KR | 101581373 B1 | * | 12/2015 |

* cited by examiner

【FIG. 1】
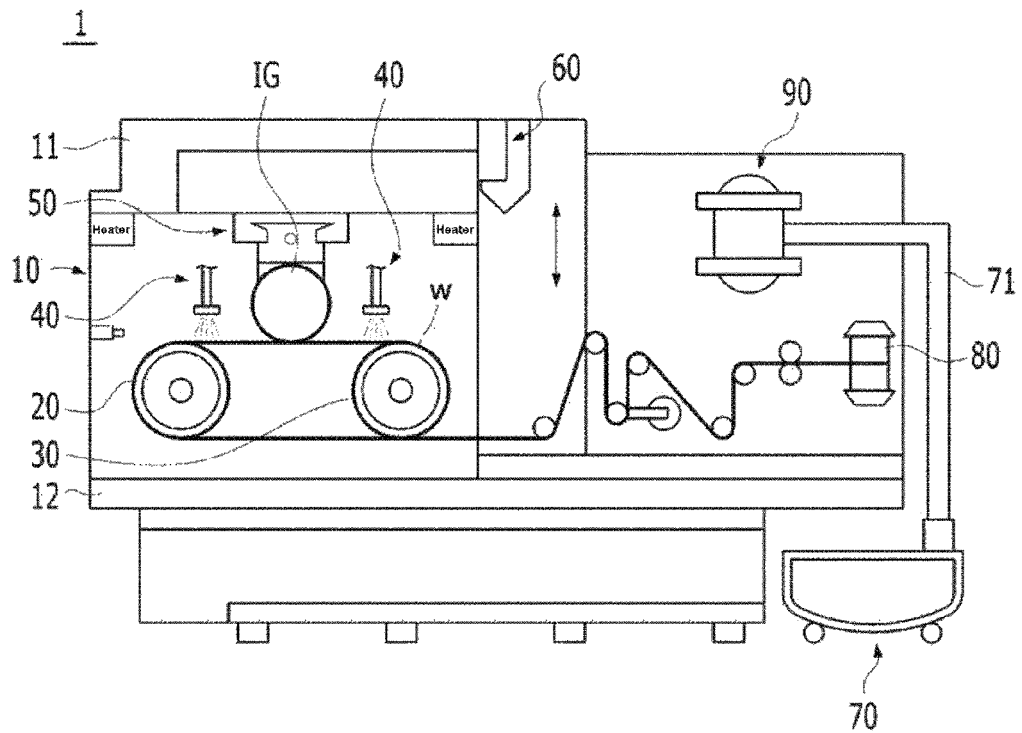
【FIG. 2】
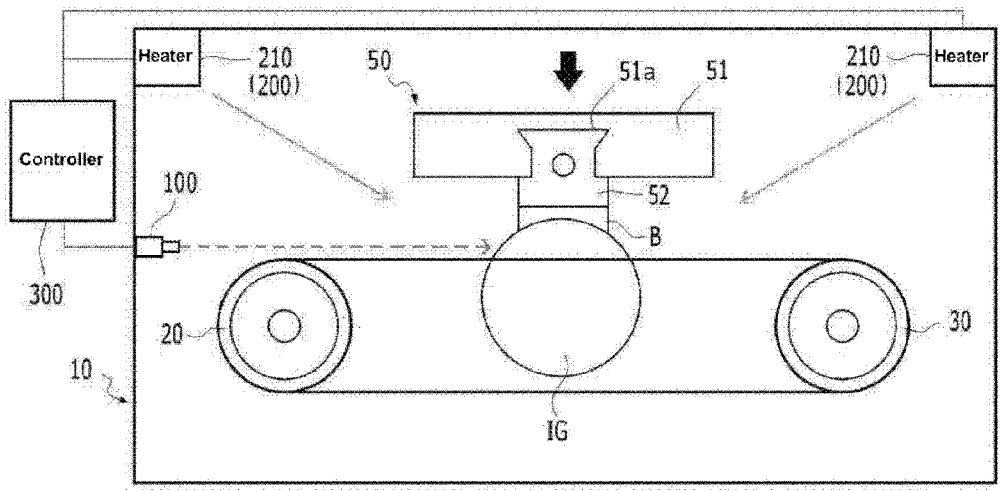

【FIG. 3】
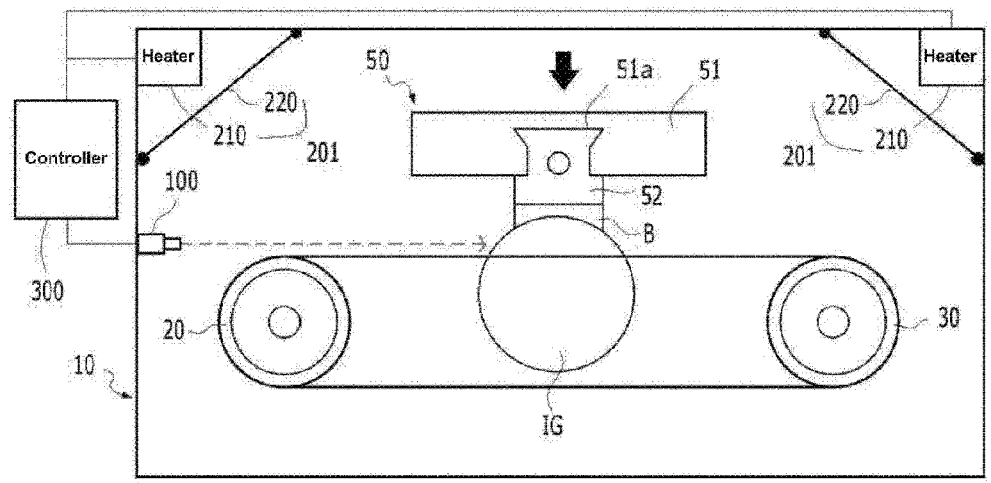
【FIG. 4】
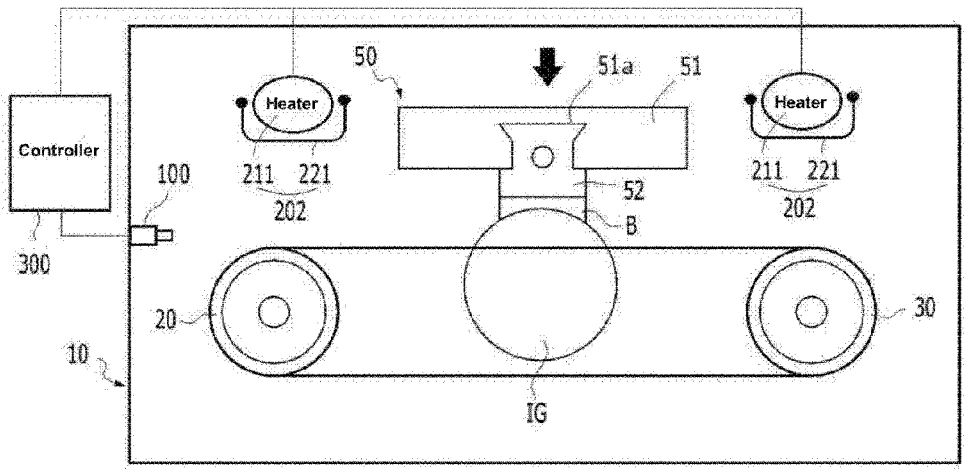

INGOT TEMPERATURE CONTROLLER AND WIRE SAWING DEVICE HAVING SAME

CROSS-REFERENCE TO RELATED PATENT APPLICATIONS

This application is a U.S. National Stage Application under 35 U.S.C. § 371 of PCT Application No. PCT/KR2020/006073, filed May 8, 2020, which claims priority to Korean Patent Application No. 10-2020-0010913, filed Jan. 30, 2020, whose entire disclosures are hereby incorporated by reference.

TECHNICAL FIELD

Embodiments relate to a wafer manufacturing apparatus, and more particularly to an ingot temperature controller and a wire sawing apparatus including the same.

BACKGROUND ART

In general, a single-crystal silicon ingot may be grown and manufactured using a Czochralski method. This method is a method of melting polycrystalline silicon in a crucible in a chamber, soaking a seed crystal, which is a single crystal, in the melted silicon, and slowing raising the seed crystal so as to be grown as a single-crystal silicon ingot (hereinafter referred to as an ingot) having a desired diameter.

A single-crystal silicon wafer manufacturing process includes a single-crystal growth process of forming an ingot using the above method, a slicing process of slicing the ingot to obtain a thin disc-shaped wafer, an edge grinding process of grinding an edge of the wafer obtained through the slicing process in order to prevent fracture or distortion of the wafer, a lapping process of removing damage due to mechanical machining remaining on the wafer in order to improve flatness of the wafer, a polishing process of polishing the wafer, and a cleaning process of removing a polishing agent and foreign matter from the polished wafer.

Meanwhile, the slicing process of slicing the ingot into the wafer is preformed using various methods. That is, an outer diameter saw (O.D.S) method of cutting the ingot using diamond particles attached to an outer circumferential portion of a thin plate, an inner diameter saw (I.D.S) method of cutting the ingot using diamond particles attached to an inner circumferential portion of a doughnut-shaped thin plate, and a wire saw method of spraying a slurry solution onto a wire while moving the wire at a high speed to cut the ingot using friction between the ingot and the slurry attached to the wire are used.

There among, the wire saw method is widely used, since it is possible to simultaneously cut the ingot into a plurality of wafers, whereby it is possible to improve production yield per unit time. A wire sawing apparatus performs the ingot slicing process using the wire saw method.

A general wire sawing apparatus includes a chamber, an ingot clamp configured to clamp an ingot IG in an upper part of the chamber, a plurality of rollers configured to be rotated under the ingot clamp, a wire configured to be rotated in alternating directions while being wound around the plurality of rollers, and a slurry spray nozzle configured to spray slurry.

In the wire sawing apparatus, when an ingot is mounted to the ingot clamp, the wire wound around the rollers is reciprocated, and the slurry is sprayed onto the wire through the slurry spray nozzle.

At this time, the ingot clamp downwardly moves the ingot toward the wire moved at the high speed, and the ingot is cut into a plurality of wafers due to friction between the ingot and the slurry attached to the wire. During the slicing process, the ingot swells in the chamber while the temperature of the ingot is being increased by process heat generated due to rotation of the rollers and the wire and friction between the wire and the ingot.

Meanwhile, during the slicing process, overload may occur due to friction heat between the wire and the ingot, whereby the wire may be broken, and therefore the operation of the wire sawing apparatus may be stopped. When an error occurs in the wire sawing apparatus, as described above, the slicing process is stopped, and the ingot swollen by the process heat starts to gradually shrink.

When the wire sawing apparatus is repaired and then the slicing process is resumed, the shrunk ingot swells again due to process heat, whereby a cutting position may be offset, and therefore quality of the cut wafer may be deteriorated.

DISCLOSURE

Technical Problem

Embodiments provide an ingot temperature controller capable of preventing quality deterioration due to shrinkage of an ingot when an error occurs in a wire sawing apparatus during a slicing process and a wire sawing apparatus including the same.

Technical Solution

An embodiment provides a wire sawing apparatus including a chamber, an ingot clamp configured to support an ingot in the chamber, a first roller and a second roller, a wire wound around the first roller and the second roller, the wire being configured to cut the ingot into a plurality of wafers while being rotated, and an ingot temperature controller including a temperature measurement unit mounted in the chamber in which the ingot is cut, the temperature measurement unit being configured to measure the temperature of the ingot, and a heater unit mounted in the chamber.

The wire sawing apparatus may further include a control unit configured to control operation of the temperature measurement unit and the heater unit in order to maintain uniform temperature of the ingot.

When the temperature measured by the temperature measurement unit is equal to or less than a set temperature, the control unit may operate the heater unit.

The heater unit may be mounted in an upper area of the chamber.

The heater unit may include a heater and a cover configured to cover the heater.

The heater unit may be installed in a pair in the state in which the ingot is disposed therebetween.

The cover may be detachably installed at the chamber so as to open the heater.

The cover may be made of a waterproof material.

The temperature measurement unit may include an infrared thermometer.

The temperature measurement unit may be installed at a side wall of the chamber adjacent to the ingot.

When facility shutdown occurs during operation of the wire sawing apparatus, the control unit may operate the temperature measurement unit and the heater unit.

Another embodiment provides an ingot controller including an ingot temperature controller including a temperature measurement unit mounted in a chamber in which an ingot is cut, the temperature measurement unit being configured to measure the temperature of the ingot, and a heater unit mounted in the chamber.

The ingot controller may further include a control unit configured to control operation of the temperature measurement unit and the heater unit.

When facility shutdown occurs during operation of a wire sawing apparatus, the control unit may operate the temperature measurement unit and the heater unit.

Advantageous Effects

An ingot temperature controller according to an embodiment and a wire sawing apparatus including the same have an effect in that uniform temperature in a chamber is maintained when an error occurs in the wire sawing apparatus, whereby it is possible to prevent quality deterioration due to shrinkage of an ingot, and therefore it is possible to improve wafer production quality.

DESCRIPTION OF DRAWINGS

FIG. 1 is a schematic view showing the construction of a wire sawing apparatus according to an embodiment.

FIG. 2 is a detailed view of a chamber area of FIG. 1, showing an ingot temperature controller according to a first embodiment.

FIG. 3 is a view showing an ingot temperature controller according to a second embodiment.

FIG. 4 is a view showing an ingot temperature controller according to a third embodiment.

BEST MODE

Hereinafter, embodiments will be clearly disclosed through the description of the embodiments with reference to the accompanying drawings. In the following description of the embodiments, it will be understood that, when an element, such as a layer (film), a region, a pattern, or a structure, is referred to as being "on" or "under" another element, such as a substrate, a layer (film), a region, a pad, or a pattern, it can be "directly" on or under another element or can be "indirectly" formed such that an intervening element is also present. Terms such as "on" or "under" are described on the basis of the drawings.

In the drawings, the size of each element is exaggerated, omitted, or schematically illustrated for convenience of description and clarity. In addition, the size of each element does not entirely reflect the actual size thereof. In addition, the same reference numerals denote the same elements throughout the description of the drawings. Hereinafter, embodiments will be described with reference to the accompanying drawings.

FIG. 1 is a schematic view showing the construction of a wire sawing apparatus according to an embodiment.

As shown in FIG. 1, the wire sawing apparatus 1 according to the embodiment may include a chamber 10, a first roller (main roller) 20, a second roller (slave roller) 30, a wire W, a slurry supply nozzle 40, an ingot clamp 50, an ingot feed unit 60, a slurry tank 70, a bobbin 80, and a heat exchanger 90.

The chamber 10 defines a space in which an ingot IG is cut, i.e. sliced. For example, the chamber 10 may be a room having a cuboidal inner space. A door (not shown) may be mounted to the chamber 10, whereby the chamber 10 may be opened when the ingot IG is introduced or when a sliced wafer is removed, and the chamber 10 may be closed during slicing. The chamber 10 may include an upper chamber 11, in which the ingot clamp 50 is mounted, and a lower chamber 12, which constitutes a bottom.

The first roller 20 may include a wire guide roller, around which the wire W is wound, a spindle configured to transmit rotational force to the wire guide roller, and a rotary shaft, to which the spindle is fixed. The first roller 20 may be called a main roller.

Similarly, the second roller 30 may include a wire guide roller, around which the wire W is wound, a spindle configured to transmit rotational force to the wire guide roller, and a rotary shaft, to which the spindle is fixed. The second roller 30 may be called a slave roller.

A plurality of wires W may be wound around outer circumferential surfaces of the first roller 20 and the second roller 30 at regular intervals. For example, the wire W may be supplied from the bobbin 80 so as to be wound around the first roller 20 and the second roller 30.

The wire W may cut the ingot IG into a plurality of wafers, which are thin plates. That is, the wire W may saw the ingot IG while being repeatedly wound around and unwound from the first roller 20 and the second roller 30. The number and thickness of sliced wafers may be set by intervals of the wound wire W.

The slurry supply nozzle 40 may be disposed above the first roller 20 and the second roller 30 in order to supply a slurry solution to the wire W. The slurry solution sprayed from the slurry supply nozzle 40 is attached to the wire W, and the ingot IG is sliced by the wire W having the slurry solution attached thereto. The slurry includes abrasive grain. When the ingot IG is moved toward the wire W and is then pressed, therefore, the ingot IG may be cut by the abrasive grain attached to the wire W.

The ingot clamp 50 supports the ingot IG in the chamber 10. The ingot clamp 50 includes a holder 51 coupled to the chamber 10 and a work plate 52 coupled to an area above the ingot IG. Since the ingot IG is mounted on the ingot clamp 50, the ingot clamp may be called a mounting block. A beam B configured to allow the ingot IG to be mounted to the ingot clamp 50 by insertion therethrough may be coupled between the ingot IG and the work plate 52.

More specifically, the holder 51 is installed in an upper area of the chamber 10, and has a clamp recess 51a formed therein. An upper part of the work plate 52 is inserted into the clamp recess 51a of the holder 51 so as to be mounted to the holder 51, and a lower part of the work plate is connected to the beam B in order to fix the ingot IG to the holder 51. The holder 51 may be made of stainless steel (SUS), and the beam B may be made of carbon.

The ingot feed unit 60 may move the ingot clamp 50 under the first roller 20 and the second roller 30 such that the ingot IG is sliced by the wire W, and may move the ingot clamp 50 to the upper area of the chamber 10 after the ingot IG is sliced into wafers.

The slurry tank 70 stores slurry, and moves the slurry through a slurry supply pipe 71 such that the slurry is sprayed from the slurry supply nozzle 40. The slurry tank 70 may include a stirring unit configured to stir the slurry solution received therein and a stirrer driving unit configured to transmit rotation force to the stirring unit.

The heat exchanger 90 may adjust the temperature of the slurry that moves to the slurry supply nozzle 40 in real time. Consequently, slurry having temperature adjusted by the heat exchanger 90 may be sprayed to the wire W.

Meanwhile, the wire sawing apparatus 1 according to the embodiment further includes an ingot temperature controller.

The ingot temperature controller may maintain uniform temperature of the ingot IG even though a slicing process is interrupted due to overload of the wire sawing apparatus, breakage of the wire, etc.

FIG. 2 is a detailed view of a chamber area of FIG. 1, showing an ingot temperature controller according to a first embodiment.

Referring to FIG. 2, the ingot temperature controller according to the first embodiment may include a temperature measurement unit 100 and a heater unit 200.

The temperature measurement unit 100 may be mounted in the chamber 10, in which the ingot IG is cut, and may measure the temperature of the ingot IG located in the chamber 10. For example, the temperature measurement unit 100 may be installed at a side wall of the chamber adjacent to the ingot IG, and may protrude inwardly of the chamber 10 so as to face the ingot IG in an arrow direction. Of course, the position of the temperature measurement unit 100 is not limited thereto, and the temperature measurement unit may be located at any position at which the temperature of the ingot can be efficiently measured.

The temperature measurement unit 100 may include various types of thermometers. For example, the temperature measurement unit 100 may include one infrared thermometer. The infrared thermometer may measure the temperature of the ingot IG in a contactless manner. Of course, the temperature measurement unit 100 may be of a contact type, or may include a plurality of thermometers, as needed.

The temperature measurement unit 100 may continuously measure the temperature of the ingot IG located in the chamber 10 during the slicing process or while the slicing process is interrupted. In addition, the temperature measurement unit 100 may not be operated during the slicing process, and may be operated only when an error, such as overload or breakage of the wire, occurs in the wire sawing apparatus 1.

The heater unit 200 may be mounted in the chamber 10, and may emit heat toward the ingot IG in the chamber 10. For example, the heater unit 200 may include a heater 210 installed in the upper area of the chamber 10, i.e. the area above the ingot IG.

In addition, a pair of heaters 210 may be installed at opposite sides of the chamber 10 in the upper area thereof in the state in which the ingot IG is disposed therebetween such that uniform temperature of the ingot IG is maintained while region-specific temperature deviation of the ingot IG is reduced.

When the temperature of the ingot measured by the temperature measurement unit 100 is equal to or lower than a predetermined temperature, the heater unit 200 may perform a heating operation.

To this end, the ingot temperature controller may further include a control unit 300 configured to control the operation of the temperature measurement unit 100 and the heater unit 200 such that the ingot IG is maintained at a uniform temperature.

The control unit 300 may be electrically connected to the temperature measurement unit 100 and the heater unit 200, and may control the operation of the temperature measurement unit 100 and the heater unit 200. That is, when facility shutdown occurs during operation of the wire sawing apparatus 1, the control unit 300 may operate the temperature measurement unit 100 and the heater unit 200.

When the slicing process is interrupted due to overload of the wire sawing apparatus 1, breakage of the wire, etc., processing heat may be dissipated, and therefore the temperature of the ingot IG may be gradually lowered. The control unit 300 may perform control such that the temperature measurement unit 100 measures the temperature of the ingot IG at the point in time at which the slicing process is interrupted, and may store the measured temperature as a set value.

When the temperature of the ingot measured by the temperature measurement unit 100 is equal to or lower than the set temperature, the control unit 300 may operate the heater unit 200.

Since uniform temperature in the chamber 10 is maintained when an error occurs in the wire sawing apparatus 1, therefore, it is possible to prevent quality deterioration due to shrinkage of the ingot, whereby it is possible to improve wafer production quality.

FIG. 3 is a view showing an ingot temperature controller according to a second embodiment.

Hereinafter, the ingot temperature controller according to the second embodiment will be described. In order to avoid a duplicate description, only the differences from the previous embodiment will be described.

As shown in FIG. 3, in the ingot temperature controller according to the second embodiment, the structure of the heater unit 200 is changed. That is, a heater unit 201 may include a heater 210 and a cover 220 configured to cover the heater 210.

The heater 210 according to this embodiment may be identical in construction to the heater 210 of the heater unit 200 according to the above embodiment, and the cover 220 may be a cover configured to selectively cover the heater 210.

During the slicing process, the interior of the chamber 10 may be contaminated by the slurry, the wire, matter cut off from the ingot (hereinafter referred to as scattering matter), etc. If the scattering matter wraps the heater 210, the heater 210 may malfunction.

In this embodiment, therefore, the heater unit 201 may further include the cover 220 in order to protect the heater 210.

The cover 220 may be made of a waterproof material so as not to be contaminated by the scattering matter.

The heater 210 may be installed at each of opposite corners of the chamber 10, and the cover 220 may be installed outside each heater 210 so as to cover the heater 210. During the slicing process, the cover 220 may be attached to the chamber 10 in a state of covering the heater 210, whereby the heater 210 may not be exposed.

If the slicing process is interrupted and the operation of the heater unit 201 is necessary, the cover 220 may be separated from the chamber 10. In addition, the cover 220 may be manually opened and closed by a person, or may be automatically opened and closed by the control unit 300.

For example, the cover 220 may be detachably coupled to the chamber 10 using a bolt, etc. In addition, the cover 220 may be configured to automatically open and close the heater 210 while being slid by a linear moving means, such as an LM guide.

FIG. 4 is a view showing an ingot temperature controller according to a third embodiment.

Hereinafter, the ingot temperature controller according to the third embodiment will be described. In order to avoid a duplicate description, only the differences from the previous embodiments will be described.

Even in this embodiment, as shown in FIG. 4, a heater unit 202 includes a heater 211 and a cover 221, like the second embodiment described above; however, the installation position thereof in the chamber 10 is different.

That is, the heater 211 may not be located at the edge of the chamber 10 but may be installed in the upper area of the chamber 10 so as to be a little closer to the ingot IG. In addition, the cover 221 may be installed at only a lower part of the heater 211. As described above, the installation position of the heater unit 202 in the chamber 10 is changed.

As described above, the ingot temperature controller according to each of the embodiments and the wire sawing apparatus including the same have an effect in that uniform temperature in the chamber is maintained when an error occurs in the wire sawing apparatus, it is possible to prevent quality deterioration due to shrinkage of the ingot, and therefore it is possible to improve wafer production quality.

The features, structures, and effects described in the above embodiments are included in at least one embodiment, but are not limited to only one embodiment. Furthermore, features, structures, and effects illustrated in each embodiment may be combined or modified in other embodiments by those skilled in the art to which the embodiments pertain. Therefore, it is to be understood that such combinations and modifications fall within the scope of the present disclosure.

INDUSTRIAL APPLICABILITY

Embodiments are applicable to a silicon wafer or semiconductor manufacturing apparatus.

The invention claimed is:

1. A wire sawing apparatus comprising:
   a chamber;
   an ingot clamp configured to support an ingot in the chamber;
   a first roller and a second roller;
   a wire wound around the first roller and the second roller, the wire being configured to cut the ingot into a plurality of wafers while being rotated;
   a slurry supply nozzle disposed above the first roller and the second roller to supply a slurry solution to the wire;
   a heat exchanger configured to adjust a temperature of the slurry that moves to the slurry supply nozzle in real time; and
   an ingot temperature controller comprising:
      a temperature measurement unit mounted in the chamber in which the ingot is cut, the temperature measurement unit being configured to measure a temperature of the ingot; and
      a heater unit mounted in the chamber.

2. The wire sawing apparatus according to claim 1, further comprising a control unit configured to control operation of the temperature measurement unit and the heater unit in order to maintain a uniform temperature of the ingot.

3. The wire sawing apparatus according to claim 2, wherein, when the temperature measured by the temperature measurement unit is equal to or less than a set temperature, the control unit operates the heater unit to perform a heating operation.

4. The wire sawing apparatus according to claim 1, wherein the heater unit is mounted in an upper area of the chamber.

5. The wire sawing apparatus according to claim 4, wherein the heater unit comprises a heater and a cover configured to cover the heater.

6. The wire sawing apparatus according to claim 4, wherein the heater unit comprises a first heater and a second heater in a state in which the ingot is disposed between the first heater and the second heater.

7. The wire sawing apparatus according to claim 5, wherein the cover is detachably installed at the chamber so as to open the heater.

8. The wire sawing apparatus according to claim 7, wherein the cover is made of a waterproof material.

9. The wire sawing apparatus according to claim 1, wherein the temperature measurement unit comprises an infrared thermometer.

10. The wire sawing apparatus according to claim 9, wherein the infrared thermometer is installed at a side wall of the chamber adjacent to the ingot to measure the temperature of the ingot.

11. The wire sawing apparatus according to claim 2, wherein, when facility shutdown occurs during operation of the wire sawing apparatus, the control unit operates the temperature measurement unit and the heater unit.

* * * * *